(12) United States Patent
Wu et al.

(10) Patent No.: US 9,369,681 B1
(45) Date of Patent: Jun. 14, 2016

(54) RGBC COLOR FILTER ARRAY PATTERNS TO MINIMIZE COLOR ALIASING

(71) Applicant: OMNIVISION TECHNOLOGIES, INC., Santa Clara, CA (US)

(72) Inventors: Raymond Wu, Santa Clara, CA (US); Jizhang Shan, Cupertino, CA (US); Chin Poh Pang, Pleasanton, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/553,738

(22) Filed: Nov. 25, 2014

(51) Int. Cl.
*H04N 3/14* (2006.01)
*H04N 5/335* (2011.01)
*H04N 9/04* (2006.01)

(52) U.S. Cl.
CPC ...................... *H04N 9/045* (2013.01)

(58) Field of Classification Search
CPC ......... H04N 9/045; H04N 9/07; H04N 9/077; H04N 9/083
USPC .................................................. 348/273–276
See application file for complete search history.

(56) References Cited

U.S. PATENT DOCUMENTS

| 6,137,100 | A | 10/2000 | Fossum et al. |
|---|---|---|---|
| 7,688,368 | B2 | 3/2010 | Kijima et al. |
| 7,893,976 | B2 | 2/2011 | Compton et al. |
| 8,194,296 | B2 | 6/2012 | Compton et al. |
| 2007/0153104 | A1 | 7/2007 | Ellis-Monaghan et al. |
| 2007/0257998 | A1 | 11/2007 | Inoue |
| 2009/0243984 | A1* | 10/2009 | Fujinawa .......... G02F 1/133707 345/89 |
| 2011/0175981 | A1 | 7/2011 | Lai et al. |
| 2012/0013777 | A1 | 1/2012 | Mao et al. |
| 2014/0267848 | A1 | 9/2014 | Wu |
| 2015/0098005 | A1* | 4/2015 | Tsai ..................... H04N 5/3696 348/336 |

FOREIGN PATENT DOCUMENTS

| DE | 10 2012 110092 A1 | 4/2014 |
|---|---|---|
| WO | WO 02/49367 A2 | 6/2002 |
| WO | WO 2013/187001 A1 | 12/2013 |
| WO | WO 2014/063701 A1 | 5/2014 |

OTHER PUBLICATIONS

EP 15 19 6279—European Search Report, dated Mar. 15, 2016, (9 pages).

* cited by examiner

*Primary Examiner* — Yogesh Aggarwal
(74) *Attorney, Agent, or Firm* — Blakely Sokoloff Taylor & Zafman LLP

(57) ABSTRACT

Implementations of a color filter array comprising a plurality of tiled minimal repeating units. Each minimal repeating unit includes at least a first set of filters comprising three or more color filters, the first set including at least one color filter with a first spectral photoresponse, at least one color filter with a second spectral photoresponse, and at least one color filter with a third spectral photoresponse; and a second set of filters comprising one or more broadband filters positioned among the color filters of the first set, wherein each of the one or more broadband filters has a fourth spectral photoresponse with a broader spectrum than any of the first, second, and third spectral photoresponses, and wherein the individual filters of the second set have a smaller area than any of the individual filters in the first set. Other implementations are disclosed and claimed.

34 Claims, 11 Drawing Sheets

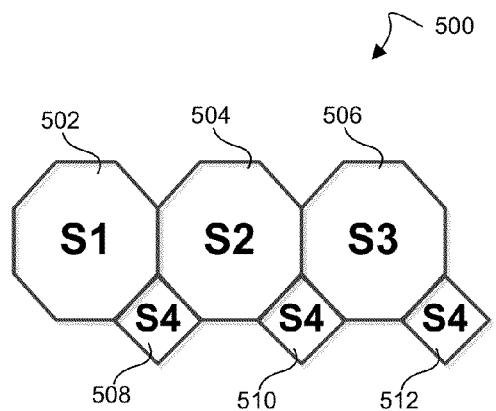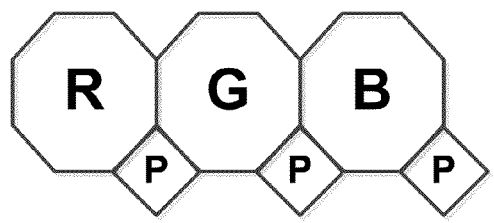
*Fig. 5A*          *Fig. 5B*
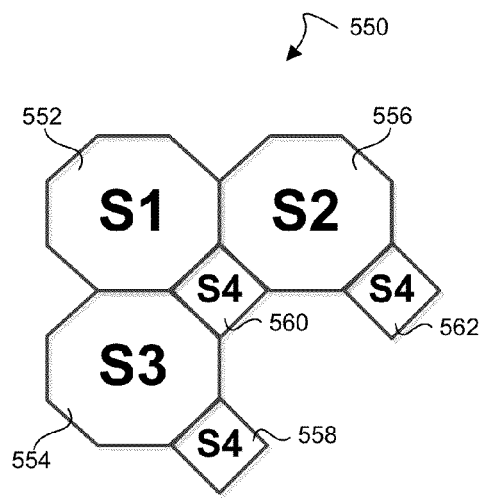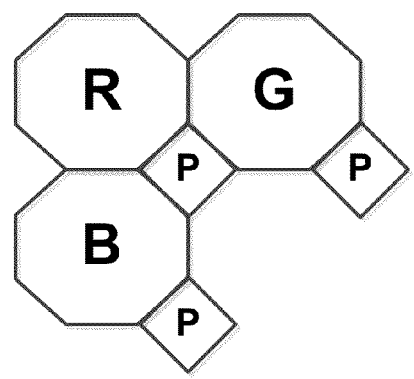
*Fig. 5C*          *Fig. 5D*

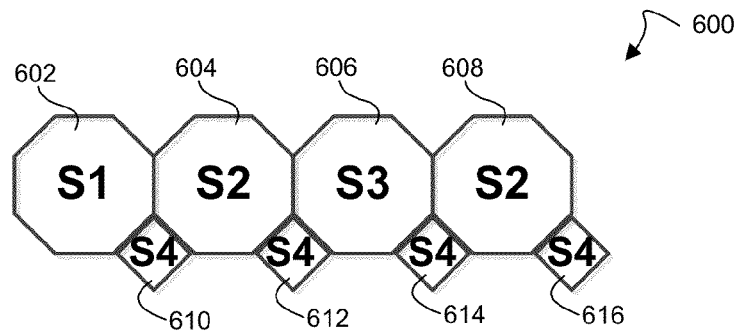
*Fig. 6A*
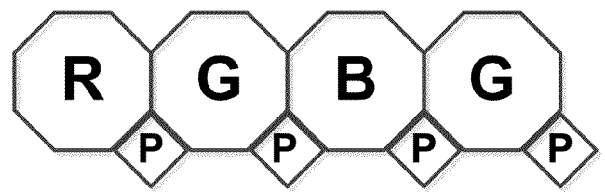
*Fig. 6B*
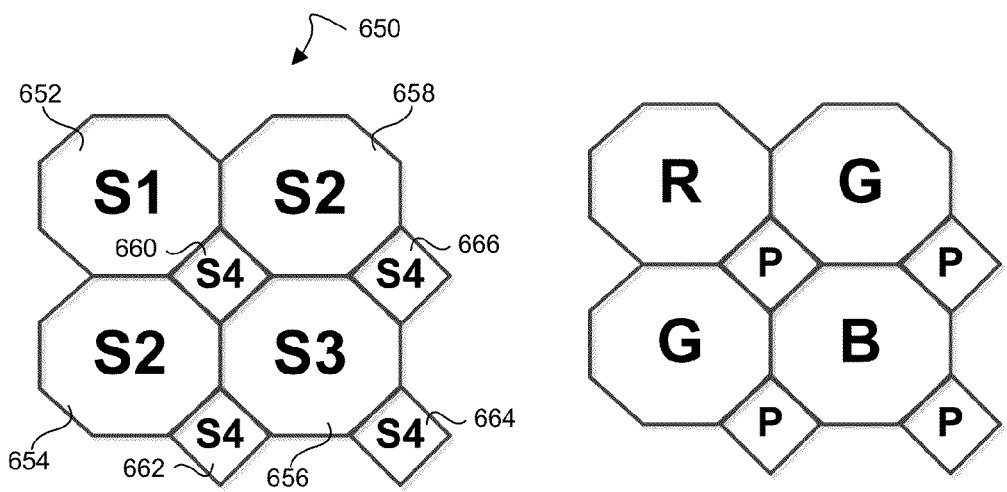
*Fig. 6C*
*Fig. 6D*

RGBC COLOR FILTER ARRAY PATTERNS TO MINIMIZE COLOR ALIASING

TECHNICAL FIELD

The disclosed embodiments relate generally to image sensors and in particular, but not exclusively, to color filter array patterns used with image sensors to minimize color aliasing.

BACKGROUND

Image sensors are widely used in digital still cameras, cellular phones, and security cameras, as well as in medical, automobile, and other applications. The technology used to manufacture image sensors, and especially complementary metal-oxide-semiconductor ("CMOS") image sensors, has continued to advance at great pace, and the demands of higher resolution and lower power consumption have encouraged further miniaturization and integration of image sensors.

Conventional CMOS image sensors use color filter arrays (CFAs) with a set of primary colors such as red, green, and blue (RGB) arranged in what is known as a Bayer pattern. In some embodiments clear pixels, also known as colorless, clear, or panchromatic pixels, can be included in the color filter array to increase the sensitivity of the image sensor. A color filter array that includes clear filters in addition to RGB color filters can be referred to as an RGBC pixel pattern.

Some RGBC patterns increase sensitivity but can suffer from color aliasing. Color aliasing results in the wrong color appearing in an area of the image. For example, a color such as red or blue can appear in a part of the image that should be green. In another example of color aliasing, a small white line on a black or otherwise dark background that registers on individual pixels will be interpreted as a line containing single pixels of each of the primary colors registered. Color aliasing occurs at least partly due to the alignment of clear filters within an RGBC pattern. Image sensors with clear pixels are more prone to color aliasing because clear pixels do not produce any color information of their own other than the intensity of light.

Color aliasing is a generally undesirable effect caused by using certain color filter array (CFA) patterns with charge-coupled device (CCD) image sensors or complementary metal oxide semiconductor (CMOS) image sensors. It is therefore desirable to design CFA patterns that minimize color aliasing.

BRIEF DESCRIPTION OF THE DRAWINGS

Non-limiting and non-exhaustive embodiments are described with reference to the following figures, wherein like reference numerals refer to like parts throughout the various views unless otherwise specified.

FIGS. 5A-5D are diagrams of other embodiments of minimal repeating units.

FIGS. 6A-6D are diagrams of other embodiments of minimal repeating units.

DETAILED DESCRIPTION OF THE ILLUSTRATED EMBODIMENTS

Embodiments are described of an apparatus, system and method for color filter array patterns used with image sensors to minimize color aliasing. Specific details are described to provide a thorough understanding of the embodiments, but one skilled in the relevant art will recognize that the invention can be practiced without one or more of the described details, or with other methods, components, materials, etc. In some instances well-known structures, materials, or operations are not shown or described in detail but are nonetheless encompassed within the scope of the invention.

Reference throughout this description to "one embodiment" or "an embodiment" means that a described feature, structure, or characteristic can be included in at least one described embodiment. As a result, appearances of "in one embodiment" or "in an embodiment" do not necessarily all refer to the same embodiment. Furthermore, the particular features, structures, or characteristics may be combined in any suitable manner in one or more embodiments.

Figure 1:
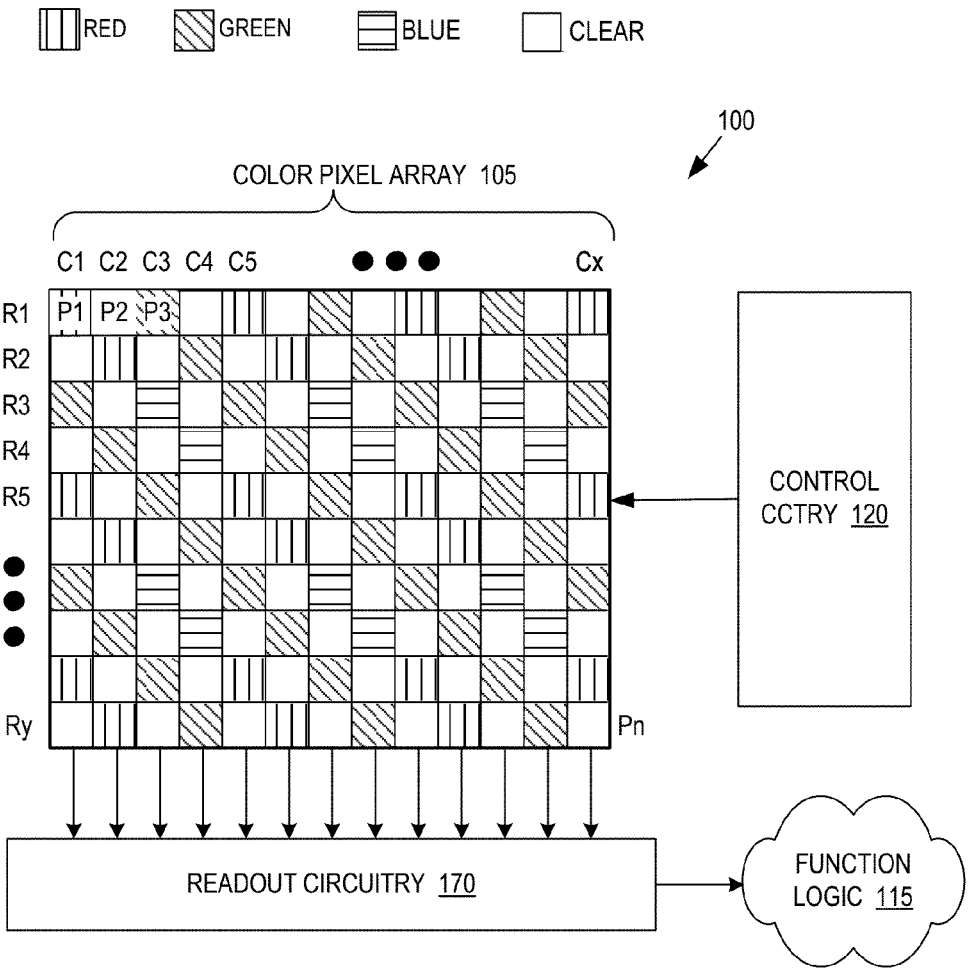
FIG. 1 is a schematic of an embodiment of an image sensor including a color filter array.
Figure 2A:
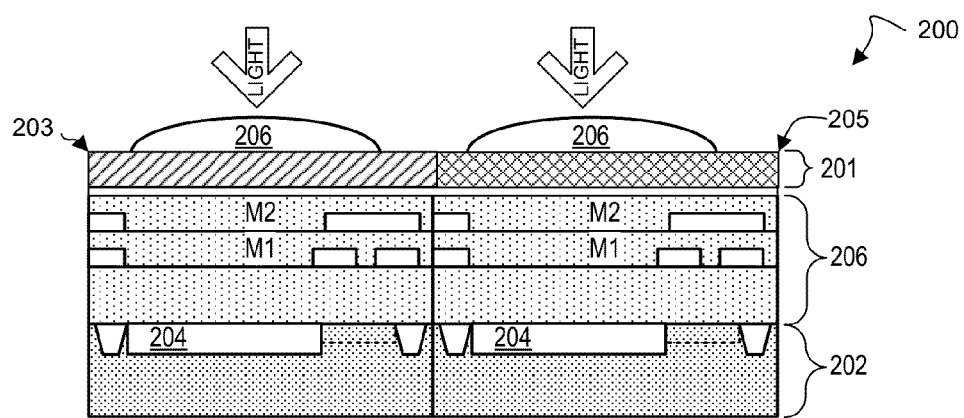
FIGS. 2A-2B are, respectively, cross-sections of embodiments of a pair of frontside illuminated pixels and embodiments of a pair of backside-illuminated pixels.
Figure 2B:
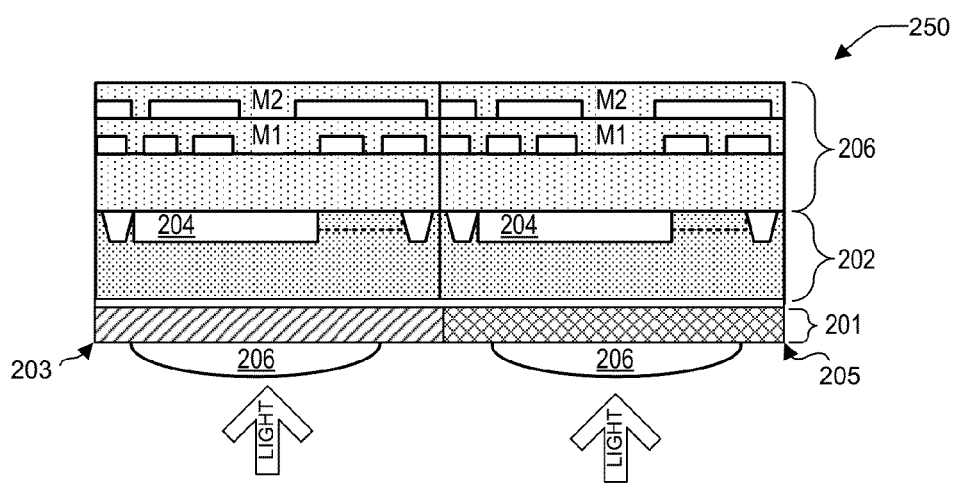

FIG. 1 illustrates an embodiment of a complementary metal oxide semiconductor (CMOS) image sensor 100 including a color pixel array 105, readout circuitry 170 coupled to the pixel array, function logic 115 coupled to the readout circuitry, and control circuitry 120 coupled to the pixel array. Color pixel array 105 is a two-dimensional ("2D") array of individual imaging sensors or pixels (e.g., pixels P1, P2 . . . , Pn) having X pixel columns and Y pixel rows. Color pixel array 105 can be implemented in a frontside-illuminated image sensor, as shown in FIG. 2A, or as a backside-illuminated image sensor, as shown in FIG. 2B. As illustrated, each pixel in the array is arranged into a row (e.g., rows R1 to Ry) and a column (e.g., column C1 to Cx) to acquire image data of a person, place, or object, which can then be used to render a 2D image of the person, place, or object. Color pixel array 105 assigns color to each pixel using a color filter array ("CFA") coupled to the pixel array, as further discussed below in connection with the disclosed embodiments of color filter arrays.

After each pixel in pixel array 105 has acquired its image data or image charge, the image data is read out by readout circuitry 170 and transferred to function logic 115 for storage, additional processing, etc. Readout circuitry 170 can include amplification circuitry, analog-to-digital ("ADC") conversion circuitry, or other circuits. Function logic 115 can store the image data and/or manipulate the image data by applying post-image effects (e.g., crop, rotate, remove red eye, adjust brightness, adjust contrast, or otherwise). Function logic 115 can also be used in one embodiment to process the image data to correct (i.e., reduce or remove) fixed pattern noise. Control circuitry 120 is coupled to pixel array 105 to control operational characteristic of color pixel array 105. For example, control circuitry 120 can generate a shutter signal for controlling image acquisition.

FIG. 2A illustrates a cross-section of an embodiment of a pair of frontside-illuminated (FSI) pixels 200 in a CMOS image sensor. The front side of FSI pixels 200 is the side of substrate 202 upon which the photosensitive area 204 and associated pixel circuitry are disposed, and over which metal stack 206 for redistributing signals is formed. Metal stack 206 includes metal layers M1 and M2, which are patterned to create an optical passage through which light incident on FSI pixels 200 can reach photosensitive or photodiode ("PD") regions 204. To implement a color image sensor, the front side can include color filter array 201, with each of its individual color filters (individual filters 203 and 205 are illustrated in this particular cross section) disposed under a microlens 206 that aids in focusing incident light onto PD region 204. Color filter array 201 can be any color filter array discussed herein.

FIG. 2B illustrates a cross-section of an embodiment of a pair of backside-illuminated (BSI) pixels 250 in a CMOS image sensor. As in FSI pixels 200, the front side of pixels 250 is the side of substrate 202 upon which the photosensitive regions 204 and associated pixel circuitry are disposed, and over which metal stack 206 is formed for redistributing signals. The backside is the side of substrate 202 opposite the front side. To implement a color image sensor, the backside can include color filter array 201, with each of its individual color filters (individual filters 203 and 205 are illustrated in this particular cross section) disposed under a microlens 206. Color filter array 201 can be any color filter array discussed herein. Microlenses 206 aid in focusing incident light onto photosensitive regions 204. Backside illumination of pixels 250 means that the metal interconnect lines in metal stack 206 do not obscure the path between the object being imaged and the photosensitive regions 204, resulting in greater signal generation by photosensitive regions 204.

Figure 3:
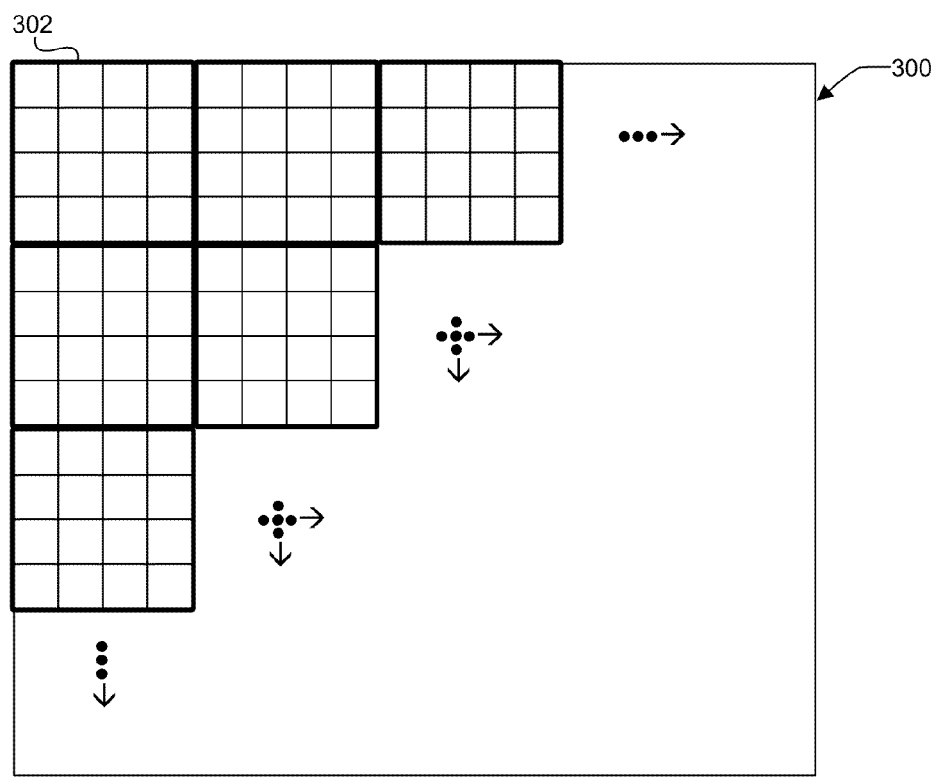
FIG. 3 is a diagram of an embodiment of a color filter array (CFA) formed by tiling multiple minimal repeating units (MRUs).

FIG. 3 illustrates a color filter array (CFA) and a set of minimal repeating units (MRUs) that are tiled to form the CFA. CFA 300 includes a number of individual filters that substantially corresponds to the number of individual pixels in the pixel array to which the CFA is or will be coupled. Each individual filter is optically coupled to a corresponding individual pixel in the pixel array and has a particular color photoresponse selected from a set of photoresponses. A particular photoresponse has high sensitivity to certain portions of the electromagnetic spectrum while simultaneously having low sensitivity to other portions of the spectrum. The pixels themselves are not colored, but because CFAs assign a separate photoresponse to each pixel by placing a filter over the pixel, it is common to refer to a pixel as a pixel of that particular photoresponse. Hence a pixel can be referred to as a "clear pixel" if it has no filter or is coupled to a clear (i.e., colorless or panchromatic) filter, as a "blue pixel" if it is coupled to a blue filter, as a "green pixel" if it is coupled to a green filter, or as a "red pixel" if it is coupled to a red filter, and so on.

The set of color photoresponses selected for use in a sensor usually has at least three colors, but in some embodiments can include four or more. In an embodiment of CFA 300 with four color photoresponses, the set of photoresponses can be red, green, blue, and clear or panchromatic (i.e., neutral or colorless). But in other embodiments CFA 300 can include other photoresponses in addition to, or instead of, those listed. For instance, other embodiments can include cyan (C), magenta (M), and yellow (Y) filters, clear (i.e., colorless) filters, infrared filters, ultraviolet filters, x-ray filters, etc.

As used herein, a white, clear, colorless, or panchromatic photoresponse refers to a photoresponse having a broader spectral sensitivity than those spectral sensitivities represented in the selected set of color photoresponses. A panchromatic photosensitivity can have high sensitivity across the entire visible spectrum. The term panchromatic pixel will refer to a pixel having a panchromatic photoresponse. Although the panchromatic pixels generally have a broader spectral sensitivity than the set of color photoresponses, each panchromatic pixel can have an associated filter. Such filter is either a neutral density filter or a color filter.

The individual filters in CFA 300 are grouped into minimal repeating units (MRUs) such as MRU 302, and MRUs 302 are tiled vertically and horizontally, as indicated by the arrows, to form CFA 300. A minimal repeating unit is a repeating unit such that no other repeating unit has fewer individual filters. A color filter array can include several different repeating units, but a repeating unit is not a minimal repeating unit if there is another repeating unit in the array with fewer individual filters. Other embodiments can also include a filter array with an MRU that includes a greater or lesser number of pixels than illustrated for MRU 302.

Figure 4A:
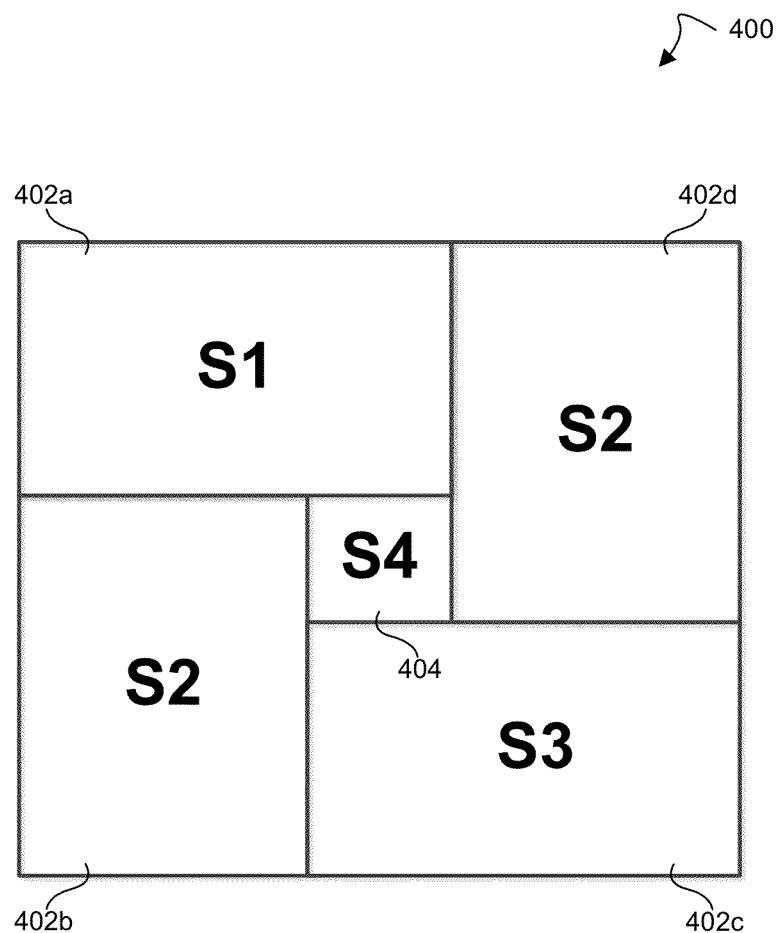
FIGS. 4A-4E are diagrams of embodiments of minimal repeating units.

FIG. 4A illustrates an embodiment of a minimal repeating unit (MRU) 400. MRU 400 includes four quadrilateral filters 402a-402d arranged to form a quadrilateral annulus. A quadrilateral annulus is a shape that results when the area of one quadrilateral is subtracted from the interior of a larger quadrilateral that has the same shape and the same center. In the illustrated embodiment, the quadrilateral annulus is a square annulus, but in other embodiments it need not be square.

In the illustrated embodiment filters 402a-402d are rectangular and of substantially the same size, but in other embodiments filters 402a-402d can be other quadrilateral shapes. In still other embodiments all four filters 402a-402d need not have the same size. At the center of the quadrilateral annulus formed by filters 402a-402d is a quadrilateral filter 404 with a smaller area than any of filters 402a-402d. The edges of filter 404 coincide with the edges of filters 402a-402d, such that filter 404 is shaped and bounded by the interior of the quadrilateral annulus formed by filters 402a-402d. In the illustrated embodiment filter 404 is square, but in other embodiments filter 404 can be a non-square quadrilateral, depending on the shapes and relative sizes of quadrilateral filters 402a-402d.

For assignment of spectral photoresponses to the individual filters in MRU 400, the individual filters can be divided into two groups: a first group including filters with three different color spectral photoresponses S1, S2, and S3; and a second group including broadband filters having a fourth photoresponse S4. Broadband means that a filter with spectral photoresponse S4 passes a broader spectrum of wavelengths than any of the filters with spectral photoresponses S1, S2, and S3, and indeed in some embodiments S4 can encompass all three of S1-S3. In MRU 400, three spectral photoresponses S1-S3 are assigned to four filters 402a-402d, meaning that any of photoresponses S1-S3 can appear twice in MRU 400; in other words, same-color-photoresponse filters can appear more than once in the MRU. For instance, in the illustrated embodiment spectral photoresponse S2 appears twice, so that in this embodiment the same-color-photoresponse filters are diagonally opposed and non-abutting. But in other embodiments same-color-photoresponse filters can be positioned differently than shown. For example the same-photoresponse filters can be positioned along a different diagonal, or can abut horizontally or vertically.

Figure 4B:
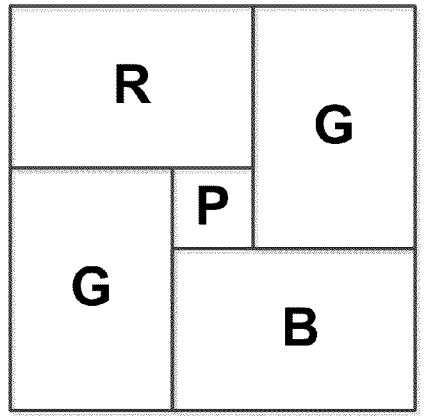

FIGS. 4B-4E illustrate embodiments of MRU 400 with specific assignments of spectral photoresponses. FIG. 4B illustrates an embodiment of MRU 400 in which spectral photoresponses S1-S3 are selected from a primary color set that includes red (R), green (G), and blue (B), also known as the RGB color set. In the illustrated embodiment S1 is red, S2 is green, and S3 is blue. Spectral photoresponse S4, which has a broader spectrum than S1-S3, is panchromatic.

Figure 4C:
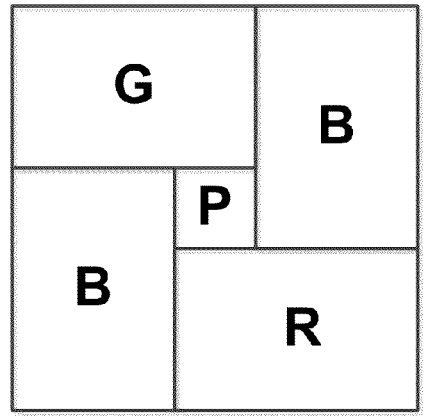

FIG. 4C illustrates an embodiment in which spectral photoresponses S1-S3 are selected from the same primary color set (RGB) as shown in FIG. 4B, but the color assignments are different. In the illustrated embodiment, S1 is green, S2 is blue, and S3 is red. As in the previous embodiment, S4 remains panchromatic.

Figure 4D:
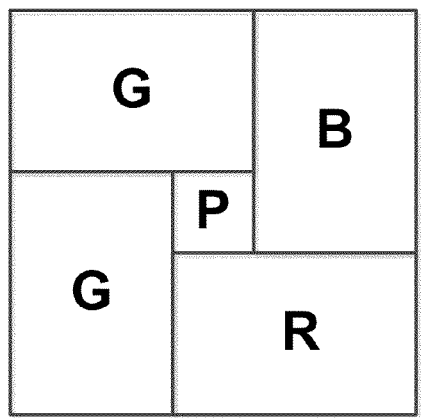

FIG. 4D illustrates an embodiment in which the two same-color-photoresponse filters are arranged differently than in FIG. 4A: in this embodiment, a pair of same-color-photoresponse filters (green in this embodiment) abut vertically instead of being diagonally opposed. In the illustrated embodiment, color photoresponses S1-S3 are selected from the RGB primary color set and S4 remains panchromatic.

Figure 4E:
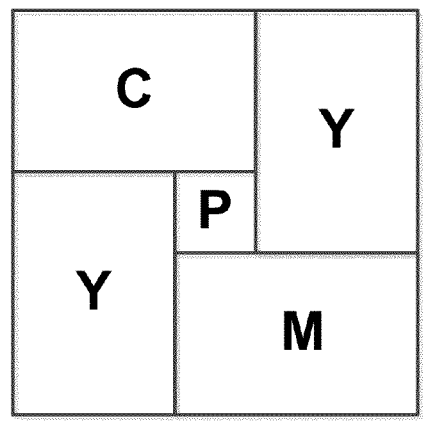

FIG. 4E illustrates an embodiment in which spectral photoresponses S1-S3 are arranged as shown in FIG. 4A, but in which spectral photoresponses S1-S3 use a different primary color set. In the illustrated embodiment, the primary color set is the cyan (C), magenta (M), and yellow (Y) color set, and the spectral photoresponses are assigned in the MRU such that S1 is cyan, S2 is yellow, and S3 is magenta.

FIG. 5A illustrates another embodiment of an MRU 500. MRU 500 includes three octagonal filters 502, 504, and 506 arranged in a straight line, with each filter having at least one edge coincident with an edge of at least one adjacent octagonal filter. In the illustrated embodiment octagonal filters 502, 504, 506 are regular octagons of equal size, but in other embodiments they need not be regular nor of equal size. MRU 500 also includes three quadrilateral filters 508, 510, and 512, meaning that there is a 1:1 ratio between octagonal and quadrilateral filters. Quadrilateral filters 508, 510, and 512 have a smaller area than any of octagonal filters 502, 504, and 506. Quadrilateral filters 508, 510, and 512 each have at least two sides formed by non-coincident edges of adjacent octagonal filters, so that in a color filter array resulting from tiling MRU 500 the quadrilateral filters 508, 510, 512 will occupy, and be bounded by, the interstitial spaces between octagonal filters. In the illustrated embodiment quadrilateral filters 508, 510, 512 are square, but in other embodiments they can be non-square quadrilaterals such as rectangles, trapezoids, or rhombuses.

Different photoresponses are assigned to individual filters in MRU 500. Color photoresponses S1-S3 are assigned to octagonal pixels 502, 504, and 506, while broadband spectral photoresponse S4 is assigned to quadrilateral pixels 508, 510, and 512. Color photoresponses S1-S3 can be selected from a primary color set such as RGB or CMY. In MRU 500, three color photoresponses are assigned to three filters, meaning that each photo response S1-S3 appears once in the MRU.

FIG. 5B illustrates an embodiment of MRU 500 in which color photoresponses S1-S3 are selected from the RGB primary color set. In the illustrated embodiment color photoresponses S1-S3 are assigned such that S1 is red, S2 is green, and S3 is blue, but in other embodiments the primary color assigned to each color photo response S1-S3 can be different. The broadband spectral photoresponse S4 assigned to quadrilateral filters 508-512 is panchromatic (P).

FIG. 5C illustrates an alternative embodiment of an MRU 550. MRU 550 includes three octagonal filters 552, 554, and 556 arranged to form a right angle, with each filter having at least one edge coincident with the edge of at least one abutting or adjacent octagonal filter. In the illustrated embodiment octagonal filters 552, 554, and 556 are regular octagons of substantially equal size, but in other embodiments they need not be regular nor of equal size. MRU 550 also includes three quadrilateral filters 558, 560, and 562, meaning that there is a 1:1 ratio between octagonal and quadrilateral filters. Quadrilateral filters 558, 560, and 562 have a smaller area than any of octagonal filters 552, 554, and 556. Each quadrilateral filter 558, 560, and 562 has at least two sides formed by non-coincident edges of adjacent octagonal filters, so that in a color filter array resulting from tiling MRU 550 the quadrilateral filters 558, 560, and 562 will occupy the interstitial spaces between octagonal filters. In the illustrated embodiment quadrilateral filters 558, 560, and 562 are square, but in other embodiments they can be non-square quadrilaterals such as rectangles, trapezoids, or rhombuses, depending on the shapes and sizes of the octagonal filters.

Different photoresponses are assigned to individual filters in MRU 550. Color photoresponses S1-S3 are assigned to octagonal pixels 502, 504, and 506, while broadband spectral photoresponse S4 is assigned to quadrilateral pixels 508, 510, and 512. Color photoresponses S1-S3 can be selected from a primary color sets such as RGB or CMY. In MRU 500, three color photoresponses are assigned to three filters, meaning that each photo response S1-S3 appears once in the MRU.

FIG. 5D illustrates an embodiment of MRU 550 in which color photoresponses S1-S3 are selected from the RGB primary color set. In the illustrated embodiment, color photoresponses S1-S3 are assigned such that S1 is red, S2 is green, and S3 is blue, but in other embodiments the assignment of primary colors to color photoresponses S1-S3 can be different. The broadband spectral photoresponse S4 assigned to quadrilateral filters 558-562 is panchromatic (P).

FIG. 6A illustrates another embodiment of an MRU 600. MRU 600 includes four octagonal filters 602, 604, 606, and 608 arranged in a straight line with each filter having at least one edge coincident with at least one edge of an abutting or adjacent octagonal filter. In the illustrated embodiment octagonal filters 602, 604, 606, and 608 are regular octagons of equal size, but in other embodiments they need not be regular nor of equal size. MRU 600 also includes four quadrilateral filters 610, 612, 614, and 616, meaning that there is a 1:1 ratio between octagonal and quadrilateral filters. Quadrilateral filters 610, 612, 614, and 616 have a smaller area than any of octagonal filters 602, 604, 606, and 608. Quadrilateral filters 610, 612, 614, and 616 each have at least two sides formed by non-coincident edges of adjacent or abutting octagonal filters, so that in a color filter array resulting from tiling MRU 600 the quadrilateral filters 610, 612, 614, and 616 will occupy the interstitial spaces between octagonal filters. In the illustrated embodiment quadrilateral filters 610, 612, 614, and 616 are square, but in other embodiments they can be non-square quadrilaterals such as rectangles, trapezoids, or rhombuses, depending on the shapes and sizes of the octagonal filters.

Different photoresponses are assigned to individual filters in MRU 600. Color photoresponses S1-S3 are assigned to octagonal pixels 602, 604, 606, and 608, while broadband spectral photoresponse S4 is assigned to quadrilateral pixels 610, 612, 614, and 616. Color spectral photoresponses S1-S3 can be selected from a primary color set such as RGB or CMY. In MRU 600, three color photoresponses are assigned to four filters, meaning that one of photoresponse S1-S3 appears twice in the MRU. The particular spectral photoresponse that appears twice, as well as the positions within the MRU of these two same-color-photoresponse filters, can be different in different embodiments.

FIG. 6B illustrates an embodiment of MRU 600 in which color photoresponses S1-S3 are selected from the RGB primary color set. In the illustrated embodiment color photoresponses S1-S3 are assigned such that S1 is red, S2 is green, and S3 is blue, but in other embodiments the primary color assigned to each color photo response S1-S3 can be different. The broadband spectral photoresponse S4 assigned to quadrilateral filters 610-616 is panchromatic (P).

FIG. 6C illustrates an alternative embodiment of an MRU 650. MRU 650 includes four octagonal filters 652, 654, 656, and 658 arranged in a square, with each octagonal filter having at least two edges coincident with the edges of an adjacent or abutting octagonal filter. In the illustrated embodiment octagonal filters 652, 654, 656, and 658 are regular octagons of substantially equal size, but in other embodiments they need not be regular nor of equal size. MRU 650 also includes four quadrilateral filters 660, 662, 664, and 666, meaning that there is a 1:1 ratio between octagonal and quadrilateral filters. Quadrilateral filters 660, 662, 664, and 666 have a smaller area than any of octagonal filters 652, 654, 656, and 658. Quadrilateral filters 660, 662, 664, and 666 each have at least two sides formed by non-coincident edges of adjacent octagonal filters, so that in a color filter array resulting from tiling MRU 650 the quadrilateral filters 660, 662, 664, and 666 will occupy the interstitial spaces between octagonal filters; quadrilateral filter 660 provides an example, as it occupies the interstitial space formed by octagonal filters 652-658. In the illustrated embodiment quadrilateral filters 610, 612, 614, and 616 are square, but in other embodiments they can be non-square quadrilaterals such as rectangles, trapezoids, or rhombuses, depending on the shapes and sizes of the octagonal filters.

Different photoresponses can be assigned to individual filters in MRU 650. Color photoresponses S1-S3 are assigned to octagonal pixels 652, 654, 656, and 658, while a broadband spectral photoresponse S4 is assigned to quadrilateral pixels 660, 662, 664, and 666. Color photoresponses S1-S3 can be selected from a primary color set such as RGB or CMY. In MRU 650, three color photoresponses are assigned to four filters, meaning that one of photoresponse S1-S3 appears twice in the MRU. The particular spectral photoresponse that appears twice, as well as the positions within the MRU of these two same-color-photoresponse filters, can be different in different embodiments.

FIG. 6D illustrates an embodiment of MRU 650 in which color photoresponses S1-S3 are selected from the RGB primary color set. In the illustrated embodiment color photoresponses S1-S3 are assigned such that S1 is red, S2 is green, and S3 is blue, but in other embodiments the assignment of primary colors to each color photo response S1-S3 can be different. The broadband spectral photoresponse S4 assigned to quadrilateral filters 660-666 is panchromatic (P).

FIGS. 7A-7F illustrate alternative embodiments of MRUs that can be formed by grouping the filters of two MRUs 600 together and varying the color photoresponses assigned to each octagonal filter, varying the positions of same-color-photoresponse filters within the MRU, or both. The MRUs in FIGS. 7A-7F each include eight octagonal filters, arranged in two lines of four, and eight quadrilateral filters, meaning that there is a 1:1 ratio between octagonal and quadrilateral filters. One of three color photoresponses S1-S3 is assigned to each of the eight octagonal filters, meaning that any one of photoresponses S1-S3 can appear multiple times in the MRU. The particular spectral photoresponses that appears multiple times, as well as the positions within the MRU of these multiple same-color-photoresponse filters, can be different in different embodiments. In the illustrated embodiments color photoresponses S1-S3 are selected from the RGB primary color set, but in other embodiments other primary color sets such as CMY can be used. Moreover, additional MRU embodiments can be formed with mirror images of the illustrated MRUs, or by a 90 degree, 180 degree, or 270 degree rotation of the illustrated MRUs.

Figure 7A:
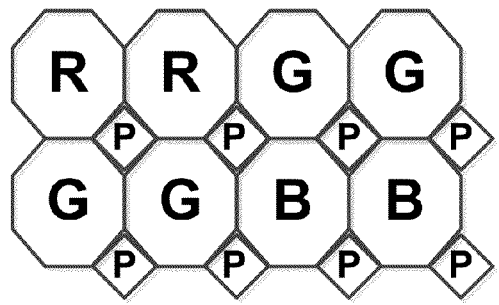
FIGS. 7A-7F are diagrams of other embodiments of minimal repeating units.

FIG. 7A illustrates an MRU with two rows of four octagonal filters. Both the top and bottom rows include two pairs of abutting same-color-photoresponse filters. In the illustrated embodiment the top row includes a pair of abutting red filters and a pair of putting green filters, giving the left-to-right color sequence RRGG while in the bottom row has a pair of abutting green filters and a pair of abutting blue filters, giving the left-to-right color sequence GGBB. All the quadrilateral filters are panchromatic.

Figure 7B:
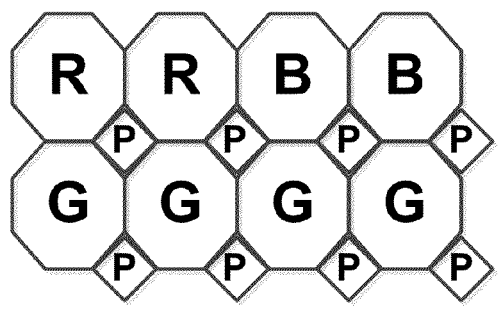

FIG. 7B illustrates another MRU with two rows of four octagonal filters. The top row includes two pairs of abutting same-color-photoresponse filters, while in the bottom row all the filters have the same spectral photoresponse. In the illustrated embodiment the top row has a pair of abutting red pixels and a pair of abutting blue pixels, so that the left-to-right color sequence is RRBB, while the bottom row includes all green filters with left-to-right color sequence GGGG. All the quadrilateral filters are panchromatic.

Figure 7C:
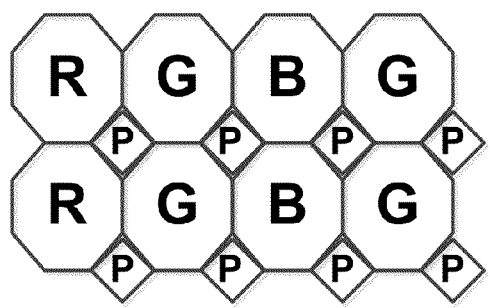

FIG. 7C illustrates another embodiment of an MRU with two rows of four octagonal filters. The top and bottom rows both include all three color photo responses, but the same-color-photoresponse filters do not abut. In the illustrated embodiment both the top and bottom rows have left-to-right color sequence RGBG. All the quadrilateral filters are panchromatic.

Figure 7D:
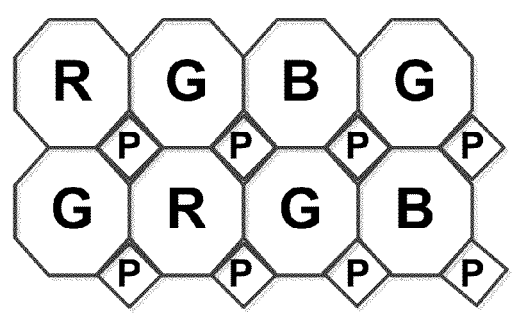

FIG. 7D illustrates another embodiment of an MRU with two rows of four octagonal filters. Both the top and bottom rows include all three color photo responses, but the same-color-photoresponse filters do not abut. In the illustrated embodiment the top row of octagonal filter, has left-to-right color sequence RGBG, while the bottom row has the left-to-right color sequence GRGB. All the quadrilateral filters are panchromatic.

Figure 7E:
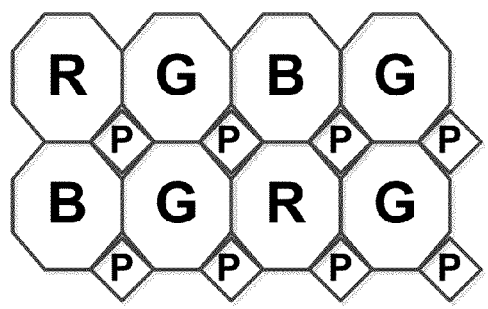

FIG. 7E illustrates another embodiment of an MRU with two rows of four octagonal filters. Both the top and bottom rows include all three color photo responses, but in this embodiment two green filters abut vertically while the other same-color-photoresponse filters do not abut. In the illustrated embodiment the top row of octagonal filters, has left-to-right color sequence RGBG, while the bottom row has left-to-right color sequence BGRG. All the quadrilateral filters are panchromatic.

Figure 7F:
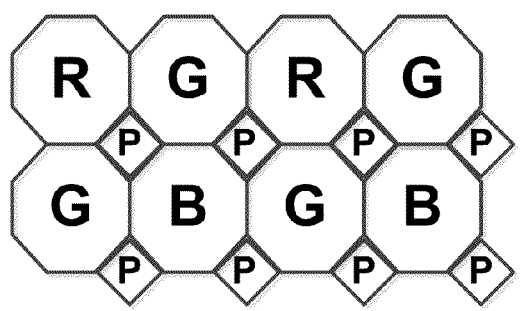
Figure 8A:
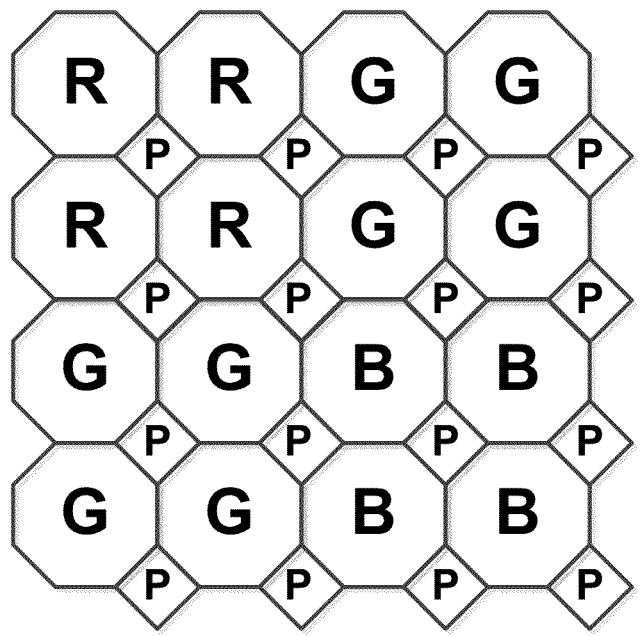
FIGS. 8A-8D are diagrams of other embodiments of minimal repeating units.
Figure 8B:
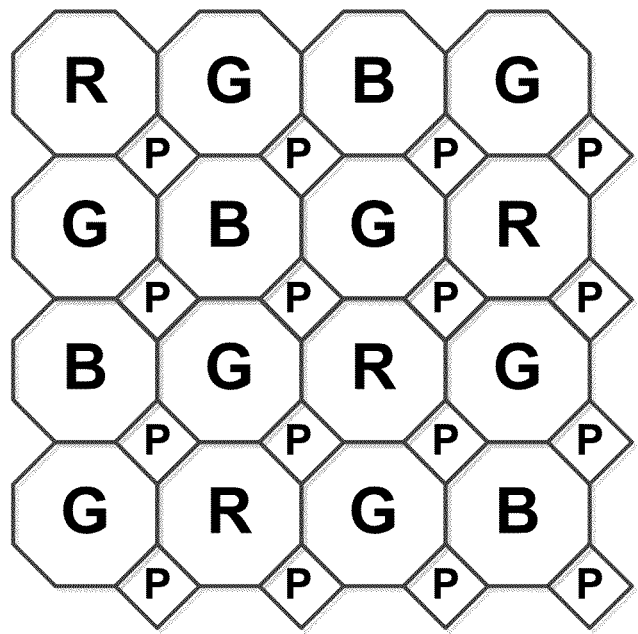
Figure 8C:
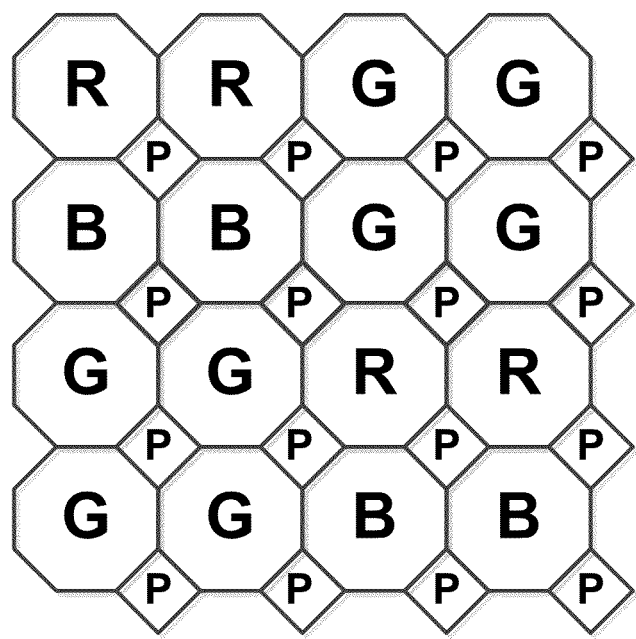
Figure 8D:
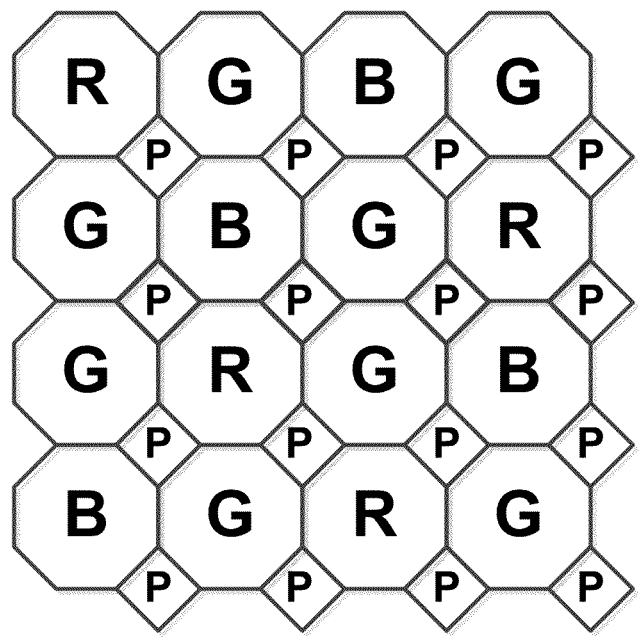

FIG. 7F illustrates another embodiment of an MRU with two rows of four octagonal filters. Both the top and bottom rows include all three color photo responses, but the same-color-photoresponse filters do not abut. In the illustrated embodiment the top row of octagonal filters, has left-to-right color sequence RGRG, while the bottom row has left-to-right color sequence GBGB. All the quadrilateral filters are panchromatic.

FIGS. 8A-8D illustrate alternative embodiments of MRUs that can be formed by grouping the filters of four MRUs 600—or, alternatively, the filters of two of the MRUs of FIGS. 7A-7F—and varying the color photoresponse assigned to each octagonal filter, the positions within the MRU of same-color-photoresponse filters, or both. The MRUs in FIGS. 8A-8D each include sixteen octagonal filters arranged in four lines of four, and sixteen quadrilateral filters, meaning that there is a 1:1 ratio between octagonal and quadrilateral filters. One of three color photoresponses S1-S3 is assigned to each of the sixteen octagonal filters, meaning that any one of photoresponses S1-S3 can appear multiple times in the MRU. The particular spectral photoresponses that appears multiple times, as well as the positions within the MRU of these multiple same-color-photoresponse filters, can be different in different embodiments. In the illustrated embodiments color photoresponses S1-S3 are selected from the RGB primary color set and broadband photoresponse S4 is panchromatic, but in other embodiments other primary color sets such as CMY can be used for photoresponses S1-S3. Moreover, additional MRU embodiments can be formed by mirror images of the illustrated MRUs, or by a 90 degree, 180 degree, or 270 degree rotation of the illustrated MRUs.

Figure 9A:
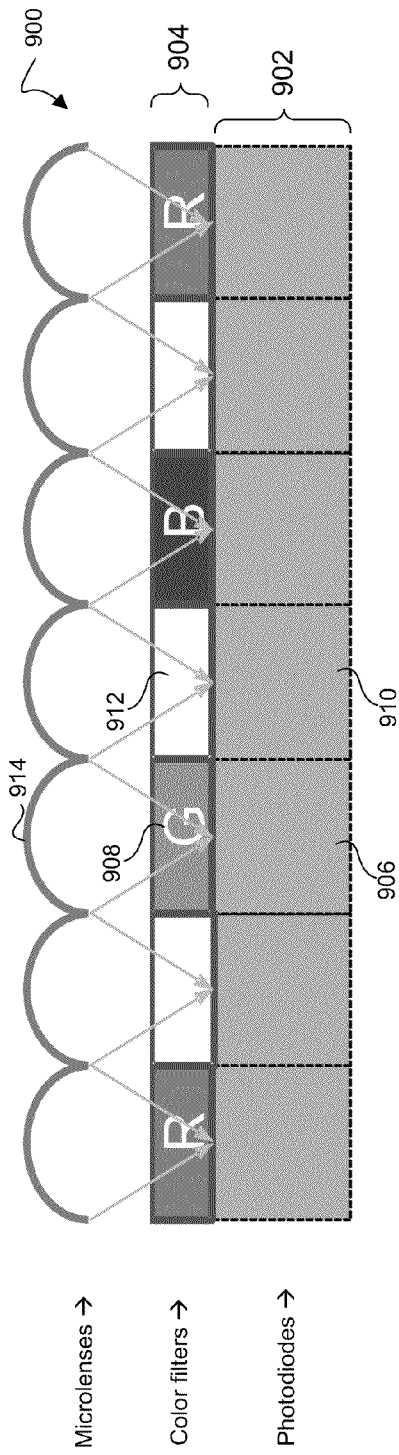
FIGS. 9A-9B are cross-sectional drawings of embodiments of pixel arrays coupled to color filter arrays.
Figure 9B:
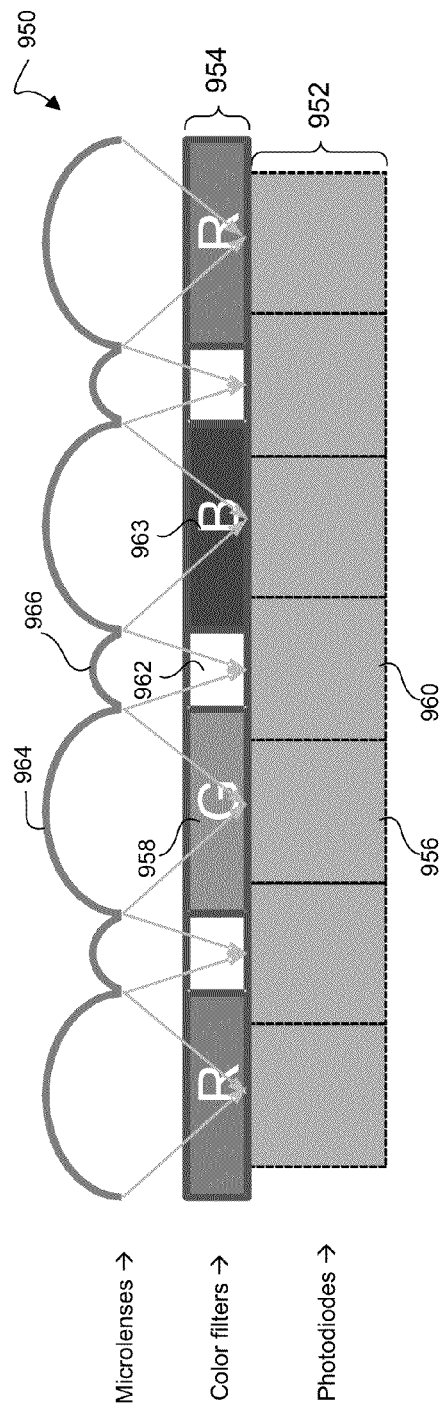

FIGS. 9A-9B illustrate embodiments of color image sensors. FIG. 9A illustrates a color image sensor 900 with a pixel array 902 that includes a plurality of photodiodes. A color filter array 904 is positioned over pixel array 902 such that each photodiode is optically coupled to a corresponding filter in the filter array. Color filter array 904 can be any of the filter arrays discussed herein. In the illustrated embodiment, then, photodiode 906 is optically coupled to color filter 908, photodiode 910 is optically coupled to broadband filter 912, and so on throughout the pixel array. Each color filter in filter array 904 is also coupled to a corresponding microlens 914. In the illustrated embodiment, the size and shape of every individual filter in filter array 901 substantially matches the size and shape of its corresponding photodiode in pixel array 902—for instance, photodiode 906 substantially matches the size and shape of filter 908, photodiode 910 substantially matches the size and shape of filter 912, and so on—but as shown in FIG. 9B this not this need not be the case in every embodiment.

FIG. 9B illustrates a color image sensor 950 with a pixel array 952 that includes a plurality of photodiodes. A color filter array 954 is positioned over pixel array 952 such that each photodiode is optically coupled to one or more corresponding filters in the filter array. Color filter array 954 can be any of the filter arrays discussed herein. In the illustrated embodiment, the size every individual filter in filter array 954 does not match the size and shape of its corresponding photodiode in pixel array 952. For instance, color filters such as filter 958 and 963 are larger than their corresponding photodiode, while broadband filters such as 962 are smaller than their corresponding photodiode. In some embodiments the shape of each filter can match the shape of its corresponding photodiode, but in other embodiments that need not be the case.

As a result of the different filter sizes, some of the photodiodes in pixel array 952 can be optically coupled to multiple filters. In the illustrated embodiment photodiode 956 is optically coupled to color filter 958, but photodiode 960 is optically coupled to broadband filter 962 and color filters 958 and 963, and so on throughout the pixel array. Each of the filters in filter array 954 can be optically coupled to a microlens that is sized to substantially match the size of the filter; in the illustrated embodiment microlens 964 substantially matches the size of filter 958, while microlens 966 substantially matches the size of filter 962.

The above description of illustrated embodiments of the invention, including what is described in the abstract, is not intended to be exhaustive or to limit the invention to the disclosed forms. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the disclosed embodiments. Rather, the scope of the invention must be determined entirely by the following claims, which must be construed according to established doctrines of claim interpretation.

The invention claimed is:

1. A color filter array comprising:
a plurality of tiled minimal repeating units, each minimal repeating unit including at least:
a first set of filters comprising three or more color filters, the first set including at least one color filter with a first spectral photoresponse, at least one color filter with a second spectral photoresponse, and at least one color filter with a third spectral photoresponse; and
a second set of filters comprising one or more broadband filters positioned among the color filters of the first set, wherein each of the one or more broadband filters has a fourth spectral photoresponse with a broader spectrum than any of the first, second, and third spectral photoresponses, and wherein the individual filters of the second set have a smaller area than any of the individual filters in the first set;
wherein:
individual filters in the first set of filters are octagonal; and
individual filters in the second set of filters are quadrilateral, wherein at least two sides of each quadrilateral filter are formed by non-abutting sides of adjacent octagonal filters.

2. The color filter array of claim 1 wherein the first set includes three filters, the second set includes three filters, and the minimal repeating unit is:

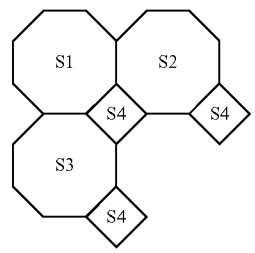

wherein S1 is the first spectral photoresponse, S2 is the second spectral photoresponse, S3 is the third spectral photoresponse, and S4 is the fourth spectral photoresponse.

3. The color filter array of claim 2 wherein the first spectral photoresponse is red (R), the second spectral photoresponse is green (G), the third spectral photoresponse is green (G), and the fourth spectral photoresponse is panchromatic (P).

4. The color filter array of claim 1 wherein the first set includes three filters, the second set includes three filters, and the minimal repeating unit is:

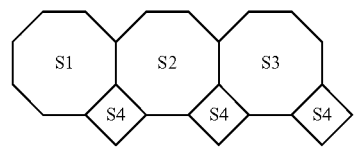

wherein S1 is the first spectral photoresponse, S2 is the second spectral photoresponse, S3 is the third spectral photoresponse, and S4 is the fourth spectral photoresponse.

5. The color filter array of claim 1 wherein the first set includes four filters, the second set includes four filters, and the minimal repeating unit is:

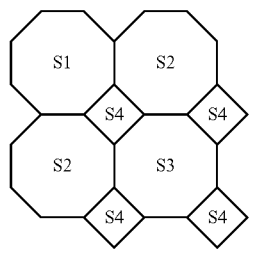

wherein S1 is the first spectral photoresponse, S2 is the second spectral photoresponse, S3 is the third spectral photoresponse, and S4 is the fourth spectral photoresponse.

6. The color filter array of claim 1 wherein the first set includes four filters, the second set includes four filters, and the minimal repeating unit is:

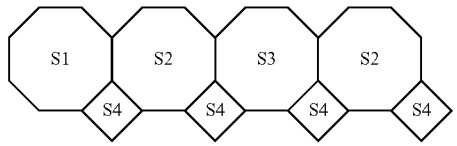

wherein S1 is the first spectral photoresponse, S2 is the second spectral photoresponse, S3 is the third spectral photoresponse, and S4 is the fourth spectral photoresponse.

7. The color filter array of claim 1 wherein the first set includes eight filters, the second set includes eight filters, and the minimal repeating unit is:

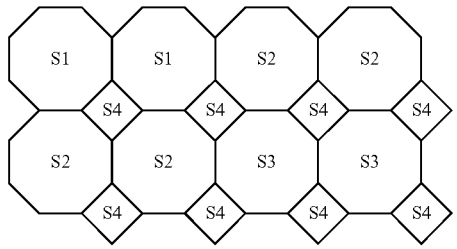

wherein S1 is the first spectral photoresponse, S2 is the second spectral photoresponse, S3 is the third spectral photoresponse, and S4 is the fourth spectral photoresponse.

8. The color filter array of claim 1 wherein the first set includes eight filters, the second set includes eight filters, and the minimal repeating unit is:

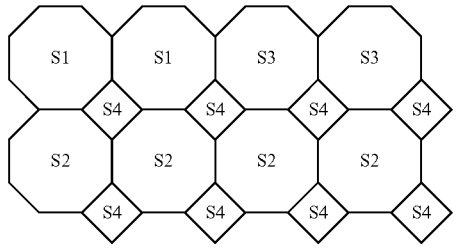

wherein S1 is the first spectral photoresponse, S2 is the second spectral photoresponse, S3 is the third spectral photoresponse, and S4 is the fourth spectral photoresponse.

9. The color filter array of claim 1 wherein the first set includes eight filters, the second set includes eight filters, and the minimal repeating unit is:

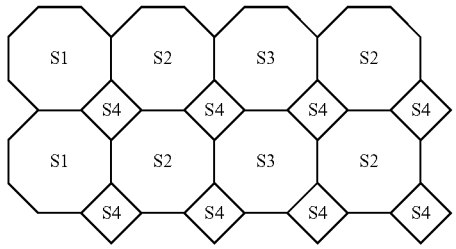

wherein S1 is the first spectral photoresponse, S2 is the second spectral photoresponse, S3 is the third spectral photoresponse, and S4 is the fourth spectral photoresponse.

10. The color filter array of claim 1 wherein the first set includes eight filters, the second set includes eight filters, and the minimal repeating unit is:

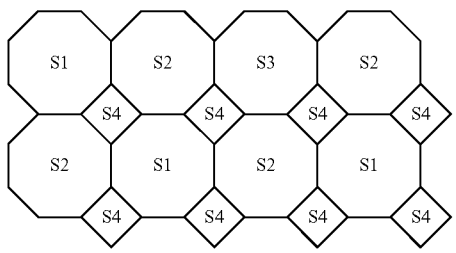

wherein S1 is the first spectral photoresponse, S2 is the second spectral photoresponse, S3 is the third spectral photoresponse, and S4 is the fourth spectral photoresponse.

11. The color filter array of claim 1 wherein the first set includes eight filters, the second set includes eight filters, and the minimal repeating unit is:

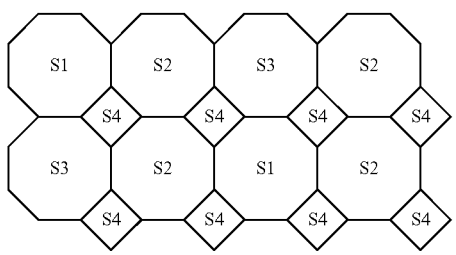

wherein S1 is the first spectral photoresponse, S2 is the second spectral photoresponse, S3 is the third spectral photoresponse, and S4 is the fourth spectral photoresponse.

12. The color filter array of claim 1 wherein the first set includes eight filters, the second set includes eight filters, and the minimal repeating unit is:

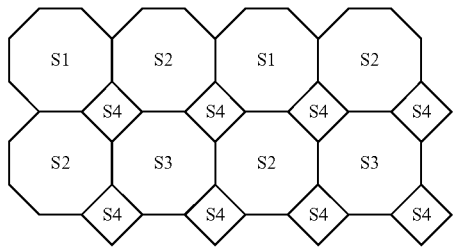

wherein S1 is the first spectral photoresponse, S2 is the second spectral photoresponse, S3 is the third spectral photoresponse, and S4 is the fourth spectral photoresponse.

13. The color filter array of claim 1 wherein the first set includes sixteen filters, the second set includes sixteen filters, and the minimal repeating unit is:

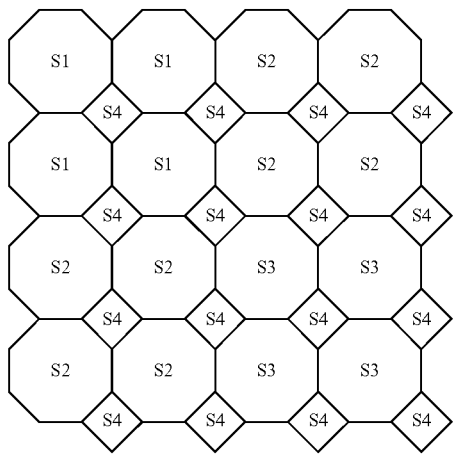

wherein S1 is the first spectral photoresponse, S2 is the second spectral photoresponse, S3 is the third spectral photoresponse, and S4 is the fourth spectral photoresponse.

14. The color filter array of claim 1 wherein the first set includes sixteen filters, the second set includes sixteen filters, and the minimal repeating unit is:

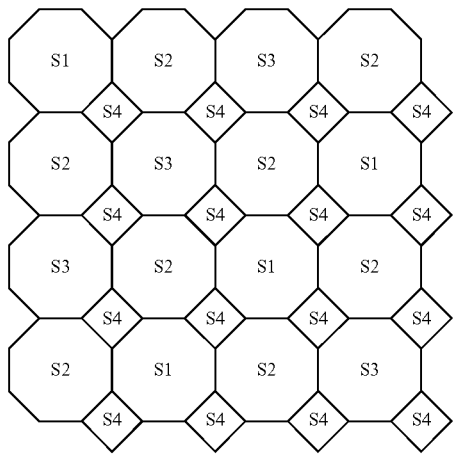

wherein S1 is the first spectral photoresponse, S2 is the second spectral photoresponse, S3 is the third spectral photoresponse, and S4 is the fourth spectral photoresponse.

15. The color filter array of claim 1 wherein the first set includes sixteen filters, the second set includes sixteen filters, and the minimal repeating unit is:

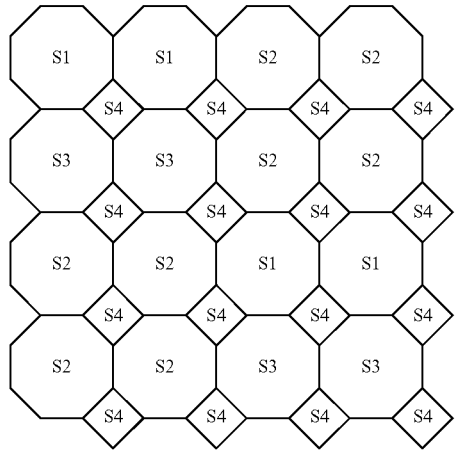

wherein S1 is the first spectral photoresponse, S2 is the second spectral photoresponse, S3 is the third spectral photoresponse, and S4 is the fourth spectral photoresponse.

16. The color filter array of claim 1 wherein the first set includes sixteen filters, the second set includes sixteen filters, and the minimal repeating unit is:

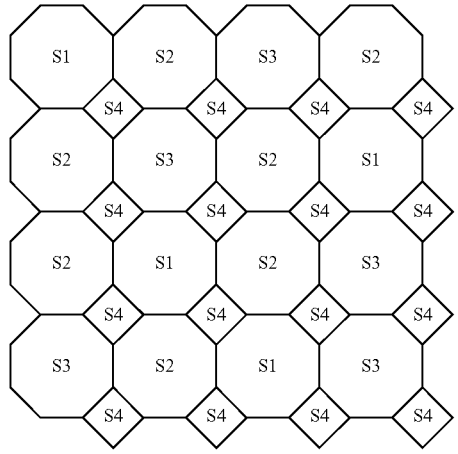

wherein S1 is the first spectral photoresponse, S2 is the second spectral photoresponse, S3 is the third spectral photoresponse, and S4 is the fourth spectral photoresponse.

17. An image sensor comprising:
a pixel array including a plurality of individual pixels;
a color filter array positioned over the pixel array such that each individual pixel in the pixel array is optically coupled to a corresponding filter of the color filter array, the color filter array comprising a plurality of tiled minimal repeating units, each minimal repeating unit including at least:

a first set of filters comprising three or more color filters, the first set including at least one color filter with a first spectral photoresponse, at least one color filter with a second spectral photoresponse, and at least one color filter with a third spectral photoresponse, and a second set of filters comprising one or more broadband filters positioned among the color filters of the first set, wherein each of the one or more broadband filters has a fourth spectral photoresponse with a broader spectrum than any of the first, second, and third spectral photoresponses, and wherein the individual filters of the second set have a smaller area than any of the individual filters in the first set;

wherein:

individual filters in the first set of filters are octagonal, and individual filters in the second set of filters are quadrilateral, wherein at least two sides of each quadrilateral filter are formed by non-abutting sides of adjacent octagonal filters;

readout circuitry coupled to the pixel array to read out signals from the individual pixels; and function logic coupled to the readout circuitry to process the signals read from the individual pixels.

18. The image sensor of claim 17 wherein the size of each filter substantially matches the size of its corresponding pixel.

19. The image sensor of claim 17 wherein the size of each filter is different than the size of its corresponding pixel.

20. The image sensor of claim 17 wherein the first set includes three filters, the second set includes three filters, and the minimal repeating unit is:

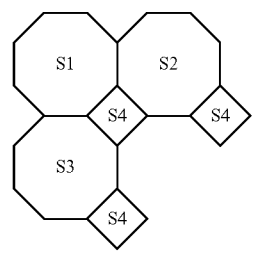

wherein S1 is the first spectral photoresponse, S2 is the second spectral photoresponse, S3 is the third spectral photoresponse, and S4 is the fourth spectral photoresponse.

21. The image sensor of claim 20 wherein the first spectral photoresponse is red (R), the second spectral photoresponse is green (G), the third spectral photoresponse is green (G), and the fourth spectral photoresponse is panchromatic (P).

22. The image sensor of claim 17 wherein the first set includes three filters, the second set includes three filters, and the minimal repeating unit is:

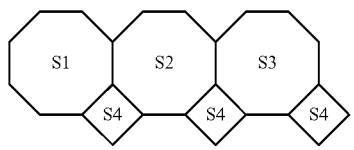

wherein S1 is the first spectral photoresponse, S2 is the second spectral photoresponse, S3 is the third spectral photoresponse, and S4 is the fourth spectral photoresponse.

23. The image sensor of claim 17 wherein the first set includes four filters, the second set includes four filters, and the minimal repeating unit is:

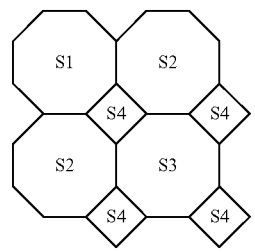

wherein S1 is the first spectral photoresponse, S2 is the second spectral photoresponse, S3 is the third spectral photoresponse, and S4 is the fourth spectral photoresponse.

24. The image sensor of claim 17 wherein the first set includes four filters, the second set includes four filters, and the minimal repeating unit is:

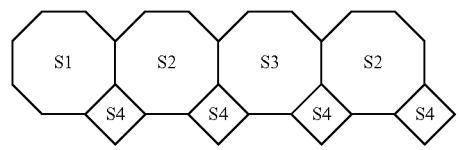

wherein S1 is the first spectral photoresponse, S2 is the second spectral photoresponse, S3 is the third spectral photoresponse, and S4 is the fourth spectral photoresponse.

25. The image sensor of claim 17 wherein the first set includes eight filters, the second set includes eight filters, and the minimal repeating unit is:

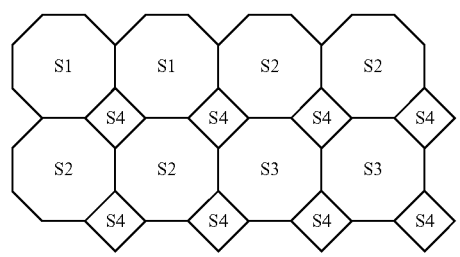

wherein S1 is the first spectral photoresponse, S2 is the second spectral photoresponse, S3 is the third spectral photoresponse, and S4 is the fourth spectral photoresponse.

26. The image sensor of claim 17 wherein the first set includes eight filters, the second set includes eight filters, and the minimal repeating unit is:

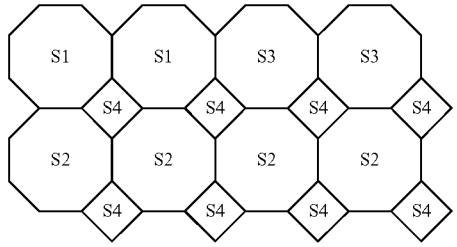

wherein S1 is the first spectral photoresponse, S2 is the second spectral photoresponse, S3 is the third spectral photoresponse, and S4 is the fourth spectral photoresponse.

27. The image sensor of claim 17 wherein the first set includes eight filters, the second set includes eight filters, and the minimal repeating unit is:

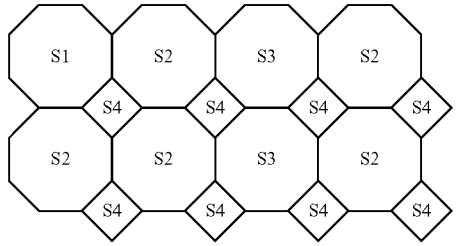

wherein S1 is the first spectral photoresponse, S2 is the second spectral photoresponse, S3 is the third spectral photoresponse, and S4 is the fourth spectral photoresponse.

28. The image sensor of claim 17 wherein the first set includes eight filters, the second set includes eight filters, and the minimal repeating unit is:

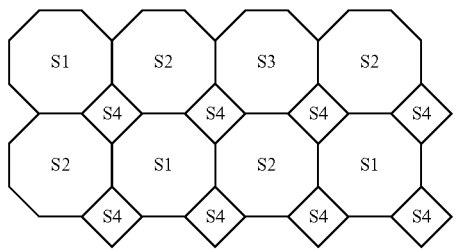

wherein S1 is the first spectral photoresponse, S2 is the second spectral photoresponse, S3 is the third spectral photoresponse, and S4 is the fourth spectral photoresponse.

29. The image sensor of claim 17 wherein the first set includes eight filters, the second set includes eight filters, and the minimal repeating unit is:

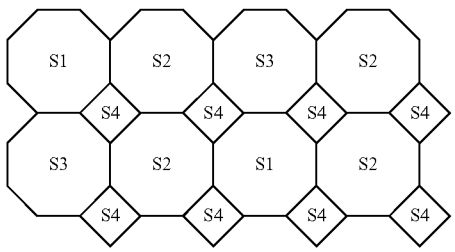

wherein S1 is the first spectral photoresponse, S2 is the second spectral photoresponse, S3 is the third spectral photoresponse, and S4 is the fourth spectral photoresponse.

30. The image sensor of claim 17 wherein the first set includes eight filters, the second set includes eight filters, and the minimal repeating unit is:

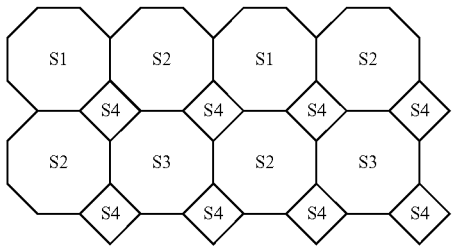

wherein S1 is the first spectral photoresponse, S2 is the second spectral photoresponse, S3 is the third spectral photoresponse, and S4 is the fourth spectral photoresponse.

31. The image sensor of claim 17 wherein the first set includes sixteen filters, the second set includes sixteen filters, and the minimal repeating unit is:

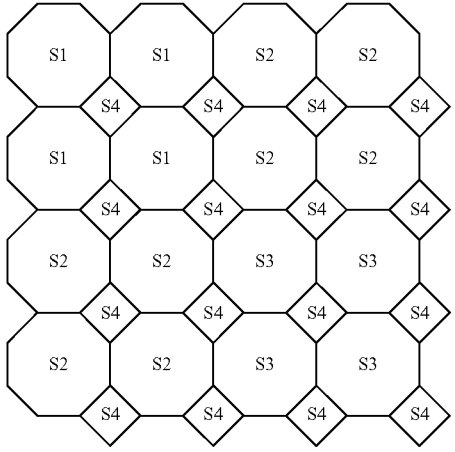

wherein S1 is the first spectral photoresponse, S2 is the second spectral photoresponse, S3 is the third spectral photoresponse, and S4 is the fourth spectral photoresponse.

32. The image sensor of claim 17 wherein the first set includes sixteen filters, the second set includes sixteen filters, and the minimal repeating unit is:

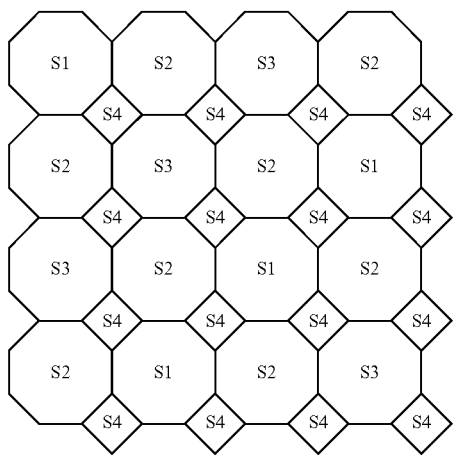

wherein S1 is the first spectral photoresponse, S2 is the second spectral photoresponse, S3 is the third spectral photoresponse, and S4 is the fourth spectral photoresponse.

33. The image sensor of claim 17 wherein the first set includes sixteen filters, the second set includes sixteen filters, and the minimal repeating unit is:

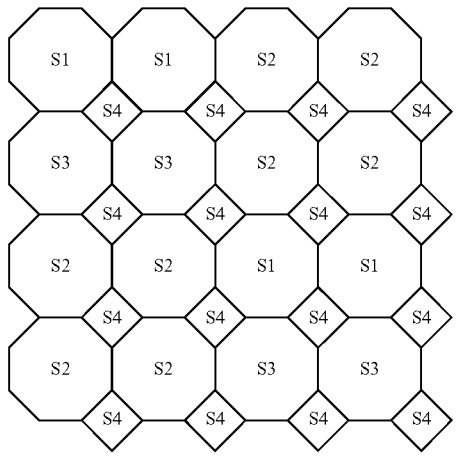

wherein S1 is the first spectral photoresponse, S2 is the second spectral photoresponse, S3 is the third spectral photoresponse, and S4 is the fourth spectral photoresponse.

34. The image sensor of claim 17 wherein the first set includes sixteen filters, the second set includes sixteen filters, and the minimal repeating unit is:

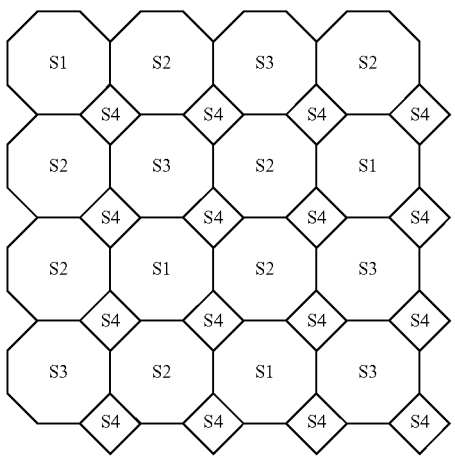

wherein S1 is the first spectral photoresponse, S2 is the second spectral photoresponse, S3 is the third spectral photoresponse, and S4 is the fourth spectral photoresponse.

* * * * *